United States Patent [19]

Lewis

[11] Patent Number: 4,815,024

[45] Date of Patent: Mar. 21, 1989

[54] SIMULATION APPARATUS

[75] Inventor: David M. Lewis, Toronto, Canada

[73] Assignee: University of Toronto, Innovations Foundation, Toronto, Canada

[21] Appl. No.: 120,261

[22] Filed: Nov. 12, 1987

[51] Int. Cl.[4] .............................................. G06G 7/62
[52] U.S. Cl. ..................................... 364/802; 364/578
[58] Field of Search ...................... 307/261, 465, 490; 324/158 T; 364/578, 602, 802

[56] References Cited

U.S. PATENT DOCUMENTS 4,215,420  7/1980  Kassakian ...................... 364/602 X
4,584,662  4/1986  Lin ...................................... 364/802

Primary Examiner—Eugene R. LaRoche
Assistant Examiner—Steven J. Mottola
Attorney, Agent, or Firm—Fleit, Jacobson, Cohn & Price

[57] ABSTRACT

An apparatus is disclosed to simulate an electronic circuit having a number of circuit elements, each being coupled to an associated set of nodes, a pair of which are capable of carrying a current therebetween, such as transistors. The apparatus has a selection device to select a circuit element to be simulated. A first memory is coupled with the selection device for storing the characteristics of each of the transistors. A transfer device transfers the characteristics from the first memory to a first register. A second memory stores the voltage present at each of the nodes, while a retrieval device retrieves the nodal voltages from the second memory and transfers them to a second register. Coupled to the first and second registers is a computation unit to ascertain the current flowing between the current carrying nodes and the subsequent change of voltage at those nodes. The apparatus carries out the simulation over a series of incremental time steps thereby providing an analog simulation of the circuit.

7 Claims, 10 Drawing Sheets

SIMULATION APPARATUS

The present invention relates to circuit simulation.

Fast hardware simulation engines are a recent development in response to the increasing complexity of very large scale integrated (VLSI) circuits, and provide a much more rapid simulation than the more conventional software packages.

Present hardware simulation engines have a digital modelling scheme and simulate the VLSI circuit as a series of time delay switches, the overall time delay of a particular region in the circuit being a progressive summation of the time delay of each circuit element. Circuits using elements such as transistors have a unique transient response which is dependent on its characteristics and the inherent capacitance in and around the transistors. In circuits which rely on the detailed characteristics of transistors, a switch level simulation may produce an incorrect result. Accordingly it would be desirable to simulate the VLSI circuit in order to obtain not only the correct logical result but also the transient response of the circuit.

Present digital hardware simulation engines, due to their digital simulating technique do not model transient response due to the necessarily high number of variables and the overly long computational time period.

Therefore, digital hardware simulators are ineffective in modelling transient response, especially in the simulation of low level circuits where the transient response must be calculated in order to simulate the circuit correctly.

It is therefore an object of the present invention to obviate or mitigate the above-mentioned disadvantages and provide a simple hardware engine utilizing analog simulation techniques.

Broadly stated the invention is an analog simulation apparatus to simulate an electronic circuit having a plurality of circuit elements, each of said circuit elements being coupled to an associated set of nodes in said circuit, said circuit elements being capable of carrying a current along a channel defined between a pair of said nodes of said set, said apparatus comprising:

selection means for selecting a circuit element to be simulated;

a first memory coupled with said selection means for storing the characteristics of each of said plurality of circuit elements, said characteristics including the respective one of said set of nodes and a scaling factor associated with each of said pair of nodes; said first memory being responsive to a first signal to identify the characteristics of said selected circuit element;

means to transfer said characteristics from said first memory to a first register for registering said characteristics of said given circuit element;

a second memory for storing the voltage present at each node in said set of nodes, said second memory being responsive to a second signal to identify the voltage present at each node of said selected circuit element;

means to retrieve from said second memory, the nodal voltages of each of said set of nodes registered in said first register, and transfer said nodal voltages to a second register;

a computation unit coupled with said first and second registers, comprising:

comparing means to compare the voltages present at said pair of nodes, so as to determine the direction of current there-between;

a first subtracting means for determining the voltage difference between said pair of nodes;

a first circuit coupled with said first subtractor to determine the current flowing between said pair of nodes said current being a function of a set of variables including said voltage difference and the scaling factors of said current carrying nodes;

a second circuit coupled with said first circuit for ascertaining the change of voltage at each of said current carrying nodes, as a function of said current and said associated scaling factor.

In a preferred embodiment, the circuit elements to be simulated are field effect transistors whose set of nodes include a gate node and a pair of current carrying nodes identified as drain and source nodes. The computation unit further comprises an identification means coupled to the output of the comparing means for distinguishing between a p-channel and an n-channel transistor. The second subtracting means determines the voltage difference between said gate and source nodes, and defined as the gate-source voltage. A third subtracting means is coupled with the second subtracting means and the third memory to determine the voltage difference between the gate-source voltage and the threshold voltage. The first circuit includes a fourth memory to receive input signals from the first and third subtracting means for identifying values of current stored therein as a variable depending on:

(i) the voltage difference between the gate-source voltage and the threshold voltage, and
(ii) the drain source voltage as is defined by the voltage difference between the respective pair of nodes.

A first adder is coupled to the output of the fourth memory for generating the sum of the logarithmic values of the current and the scaling factor for the drain node, the sum being the logarithmic value of the voltage change at the drain node. A first exponential generator receives an input signal from the first adder for determining the voltage change at the drain node. A first switching circuit receives input signals from the first exponential generator comparator and the second register for assigning an additive or subtractive sense to the drain node voltage change, depending on the output of the comparator and for determining the new voltage at the drain node.

A second adder and exponential generator as well as a second switching circuit are coupled in the same fashion as for the drain node for determining the voltage change and the subsequent new voltage at the source node.

Further features, objects and advantages of the present invention will be evident following the detailed description of a preferred embodiment, given by way of example only, as seen in the appended drawings in which:

FIGS. 1*a* and 1*b* are schematic views of a circuit element to be simulated and an example circuit comprised of such circuit elements respectively.

Figure 1B:
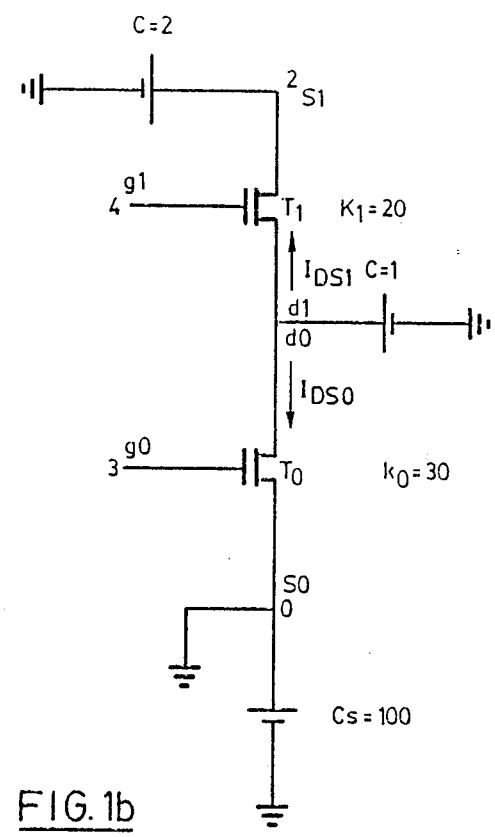

In order for the simulation to be implemented it is necessary to form a model of a typical circuit element on which all characteristics to be considered are identified. A typical and preferred circuit element is an FET transistor the family of which includes two groups, conventionally identified as the n-channel and p-channel groups. Although several models can be implemented by the present simulation apparatus, a preferred model is demonstrated in FIG. 1a wherein a common FET transistor has the following characteristics each to be described below:

s = source node
d = drain node
g = gate node
Cd = capacitance of the drain node associated to ground
Cs = capacitance of the source node associated to ground
k = characteristic factor of the transistor
Vds = drain-source voltage
Vgs = gate-source voltage
Ids = drain-source current The gate node, g, acts as the activating switch of the transistor. The application of voltage differences between the gate and source nodes and the drain and source nodes, namely Vgs and Vds respectively, causes the current Ids to flow between the current carrying nodes, namely the drain and source nodes d, s respectively. BY convention, a positive Vgs applied to an n-channel FET will permit current to flow from the drain node to the source node. In contrast, a negative Vgs applied to a p-channel FET will permit current to flow from the source node to the drain node. However, like any switching mechanism, there is a minimum Vgs necessary in order to cause such a current to flow in either FET transistor type. This is known as the threshold voltage, or more commonly known as the pinch-off voltage, and is identified by the variable Vt.

The current Ids resulting from the application of a gate-source voltage is determined by the following equations:

$$Ids = \frac{k}{2} \times (Vgs - Vt)^2 \text{ when } Vds \; Vgs - Vt \quad (1)$$

$$Ids = k\left(Vgs - Vt - \frac{Vds}{2}\right) \times Vds \text{ when } Vds \; Vgs - Vt \quad (2)$$

As can be seen by the equations (1) and (2), the current Ids is also dependent on the characteristic factor k, which is normally determined by measuring the aspect ratio of the transistor, namely the width divided by the length of the area it occupies on the integrated circuit, while taking into account typical fabrication effects.

The present simulation device reduces the time consuming computation of Ids as shown in the above equation by implementing a rapid determination of Ids by means of a look up table, wherein values of reference current Ids for a transistor having a unit k value are stored according to possible ranges of Vgs and Vds across the transistor. Accordingly, the actual current flowing through the transistor is subsequently determined by adjusting the reference current to take into account the actual k value as follows:

$$Ids = kIds' \text{ where } Ids' = Ids \text{ for } k=1 \quad (3)$$

In order to take into account the inherent capacitances in the circuit while maintaining a simplified simulation procedure, the circuit element model has a capacitance associated to ground for each of the drain and source nodes, namely Cs and Cd. This enables the accurate modelling of "wiring capacitance" which accounts for the majority of the capacitance seen in the circuit. The values of Cs and Cd can also be adjusted to take into account the inherent capacitance of the transistor.

The values of Ids', k and the nodal capacitance are incorporated into the simulation scheme by the use of The Euler forward integration method with which the voltage change may be determined at either of the drain and source nodes as follows:

$$(\text{delta}) \; V = \frac{k}{C} \; Ids' \; (\text{delta}) \; t \quad (4)$$

or by considering the voltage change after a unit time step of (delta) t:

$$(\text{delta}) \; V_i = \frac{k}{C_i} \; Ids' \text{ where } i = s \text{ or } d \quad (5)$$

Thus, the present circuit simulation device models circuit elements, for example transistors, by considering nodal capacitances associated to ground, a characteristic factor, threshold voltage, and the voltages present at each of the nodes to determine the current Ids' and the associated (delta) V at each of the drain and source nodes after a series of incremental time steps. Moreover, by repeating the simulation over the incremental time steps, a dynamic response may be obtained for each circuit element in a circuit such as that shown in FIG. 1b.

Figure 1A:
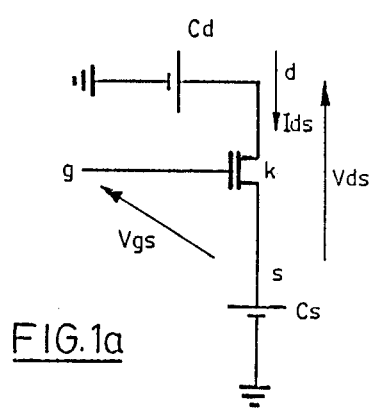

The exemplary circuit shown at FIG. 1(b) has two FET transistors T0, T1 connected in series, each having a unique set of characteristic values and nodes, each of the nodes having a particular voltage difference with respect to ground. It follows then that each transistor will have a unique current flowing from the higher nodel voltage to the lower nodal voltage.

Since the nodal voltages and currents of each transistor are unknown at the onset of the simulation, drain and source nodes are arbitrarily chosen and identified by d0, s0 for T0 and d1, s1 for T1.

It will be noted that node 1 is shared by T0 and T1 and is arbitrarily identified as a drain node for each of T0 and T1. Consequently, after each incremental step the two voltage changes, namely (delta) Vd1 and (delta) Vd0 will appear at node 1 in accordance with the currents Ids1 and Ids0. Thus, the actual nodal volt age change after each time step is the sum of the voltage changes, namely (delta) V1 = (delta) Vd0 + (delta) Vd1, and is calculated after each incremental step.

Thus, while the nodal currents are determined on the basis of nodal voltage at the beginning of the incremental simulation, nodal voltages are adjusted on the basis of an accumulated nodal voltage at the end of increment of simulation of a previous transistor. Consequently, the present simulation utilizes two tables of nodal voltages, one storing the nodal voltages at the beginning of the simulation, while the other stores nodal voltages which are adjusted at the end of each transistor simulation.

A particular feature of the present simulation technique is the use of look up tables to store circuit information in a readily accessible fashion. One such look up table is shown as Table 1 in FIG. 2 and stores information pertaining to each of the transistors to be simulated as follows:

k/Cs = scaling factor of source node
k/Cd = scaling factor of drain node
g = gate node
s = arbitrarily chosen source node
d = arbitrarily chosen drain node
UPDs = up-date control for source node
UPDd = up-date control for drain node
UPDs1 = first update control for source node
UPDd1 = first update control for drain node
Tn/p = identification of n or p channel transistor
Ttype = identification of model to be implemented in simulation The update control variables for the source and drain nodes serve as labels in the event that either or both of the arbitrarily chosen source and drain nodes are coupled to a voltage source or common ground. Moreover, the UPDs and UPDd variables control whether or not the source or drain node voltage is updated at the end of the simulation step, as will be explained. The "first" update controls for the source and drain nodes, as will be later described, are indicators to identify whether or not (one or both of) the arbitrarily chosen source and drain nodes have been used in the simulation of a previous transistor. The Tn/p signal indicates the type of transistor being simulated, being either an or a p-channel type. Finally, the T-type signal governs the selection of the circuit element model to be implemented in the simulation of a particular circuit element.

Another of the look up tables is Table 2 which stores two sets of voltage values at each node in the circuit, namely the voltage values at the "beginning" of a particular time step, and at the "end" of the time step. As will be later explained, the columns "$V_B$" and "$V_E$" switch roles at the end of a particular time step, such that the former "$V_E$" column at $T=t$ becomes the "$V_B$" column at $T=t+1$.

A further look up table, Table 3, stores values of Ids' as a function of Vgs−Vt and Vds, while another look up table, Table 4, stores values of Vt according to the variable Tn/p and a variable "Vrs", as will be described. In this manner, the present simulation technique minimises the amount of computation needed to arrive at the nodal voltages at the end of a particular time step by storing the circuit and transistor characteristics in look up tables which are repeatedly accessed during the simulation, as is shown by the dashed lines in FIG. 2.

Figure 2:
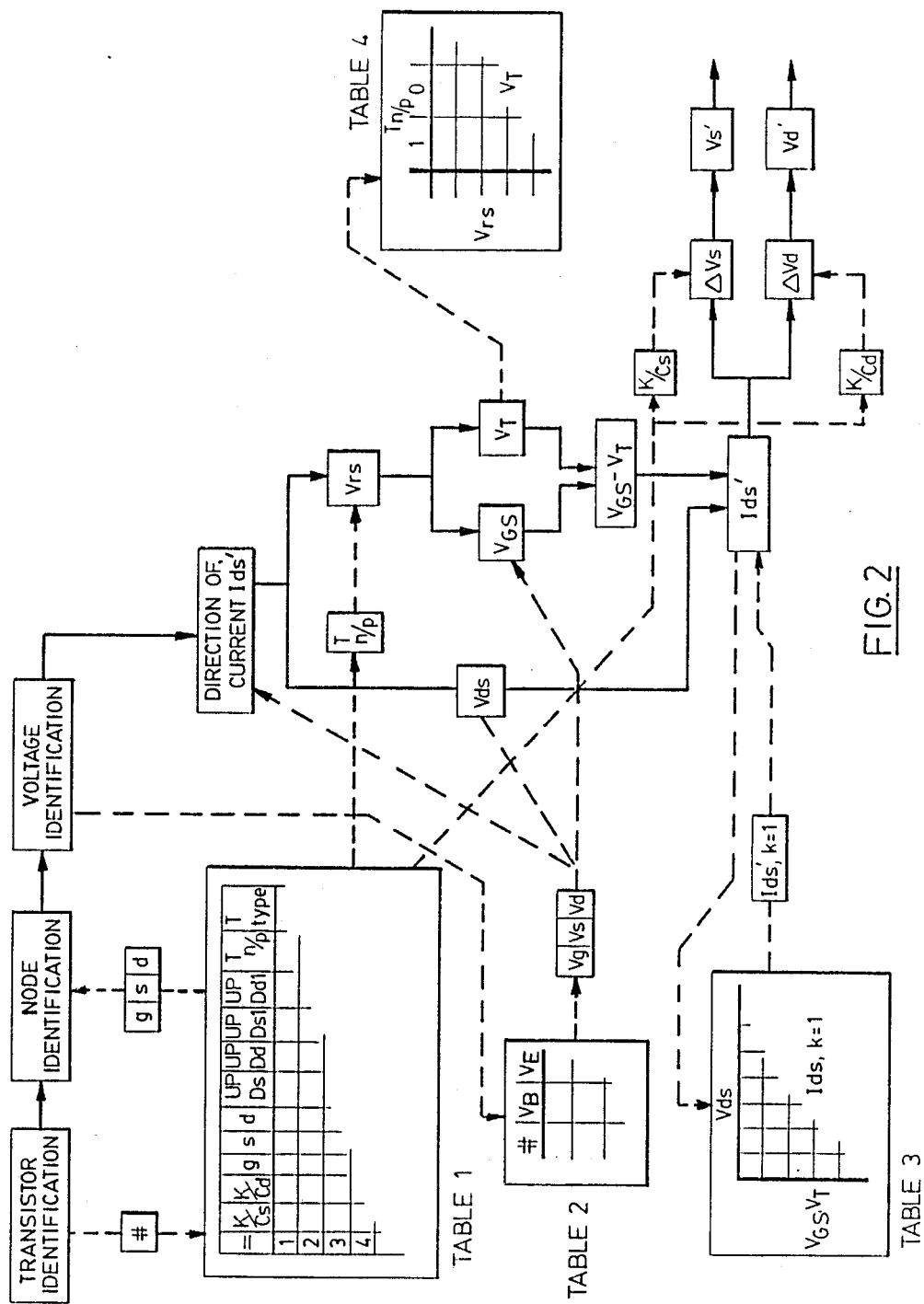
FIG. 2 is a flow diagram indicating the overall scheme of a simulation.

With reference to FIG. 2, the simulation technique is initiated by deciding which transistor is to be simulated. This is done by assigning each of the transistors a number, such that the group of transistors are represented by a series of numbers in numerically ascending order, from the first to be simulated, to the last. Once a particular transistor is identified Table 1 is accessed to obtain the particular transistor's characteristics, some of which pertain to the location of the particular transistor in the circuit. Being the second step of the technique, this involves the identification of the g, s and d node mapping from Table 1 of the transistor, as well as the characteristics Tn/p, Ttype, log (K/Cs), log (K/Cd), UPDs, UPDd, UPDs1, and UPDd1. In this case K/Cs and K/Cd are stored in logarithmic notation to further simplify the calculation procedure as will be described. With the nodes of the particular transistor known, the voltage at each node is easily and quickly obtained from Table 2.

The direction of current is then determined between the arbitrarily chosen drain and source nodes by identifying the node with the higher voltage, since current will flow from the higher voltage node.

With the direction of current, Ids, obtained the simulation scheme is split into two paths, both of which lead to the determination of Ids'. The first of the paths involves the calculation of Vds, the difference between Vd and Vs.

The second of the paths involves several steps leading to the determination of the variable (Vgs−Vt). The second path initially involves identifying the node acting as the source, that is the real source node and its associated voltage Vrs. This is determined with reference to the direction of Ids' and the type of transistor identified by variable Tn/p. For example, Vrs for an n channel transistor is as follows:

Vrs = Vs, if s is the real source node, or
Vrs = Vd, if d is the real source node Following the identification of the real source, the values of Vgs and Vt are determined simultaneously using voltage values obtained from Tables 2 and 4 respectively. In this case Vgs is the difference between Vg and Vs while Vt is selected as a function of Vrs and Tn/p.

Using the obtained values of (Vgs−Vt) and Vds, Ids' is determined by accessing Table 3, and is then used in the subsequent step of determining the change of voltage at each of the source and drain nodes, in accordance with equation (5) above.

The final step in the simulation is the adjustment of the drain and source node voltages in accordance with the respective voltage changes at the end of the time step.

Figure 3:
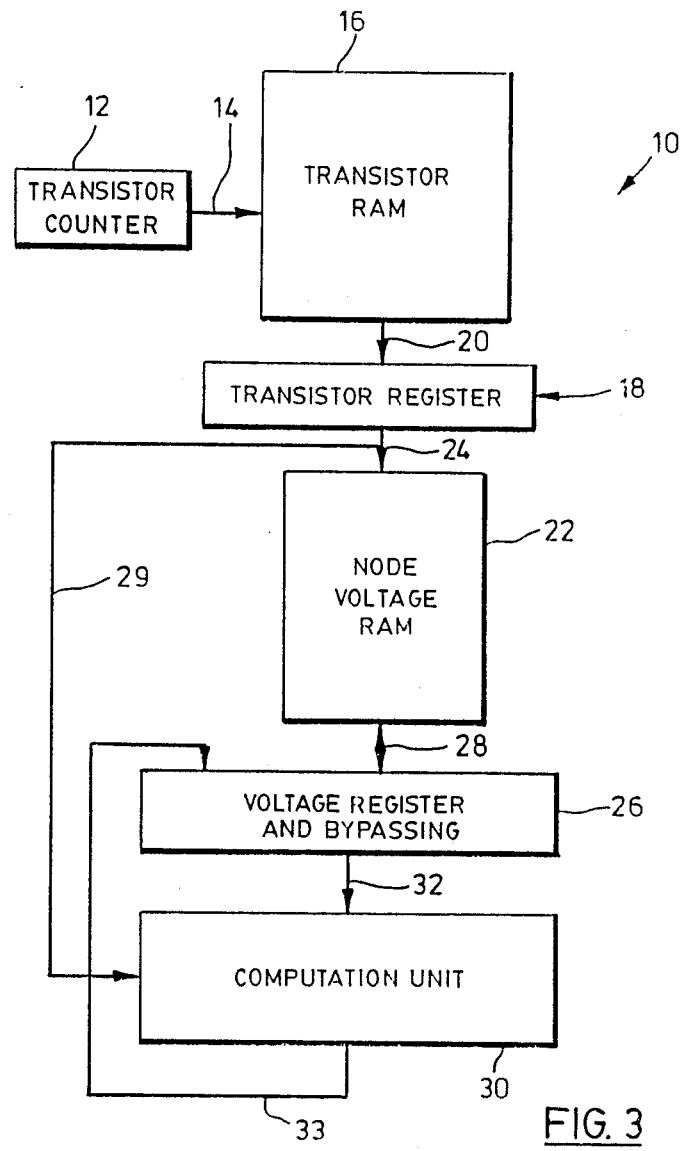
FIG. 3 is a schematic diagram of a simulation apparatus to carry out the simulation of FIG. 2.

The simulation apparatus for carrying out the overall scheme is shown in FIG. 3 by the numeral 10. The simulator 10 has a counter 12 which identifies the transistor to be simulated and conveys a signal via conductor 14 to first memory 16 which stores the characteristics of the transistor to be simulated in accordance with Table 1. These characteristics are conveyed to first register 18 via conductor 20. First register 18 conveys a signal to second memory 22 via conductor 24 for identifying the voltages present at the g, s and d nodes of the transistor, as are found in Table 2. These values are conveyed to second register 26 via conductor 28. Second register 26 conveys via conductor 32, the nodal voltages to computation unit 30 which determines the current Ids', the resulting nodal voltage changes, as well as the nodal voltages at the end of each simulation time step. These computations are also based on the transistor characteristics received on conductor 29, from first register 18, as will be described.

Figure 4:
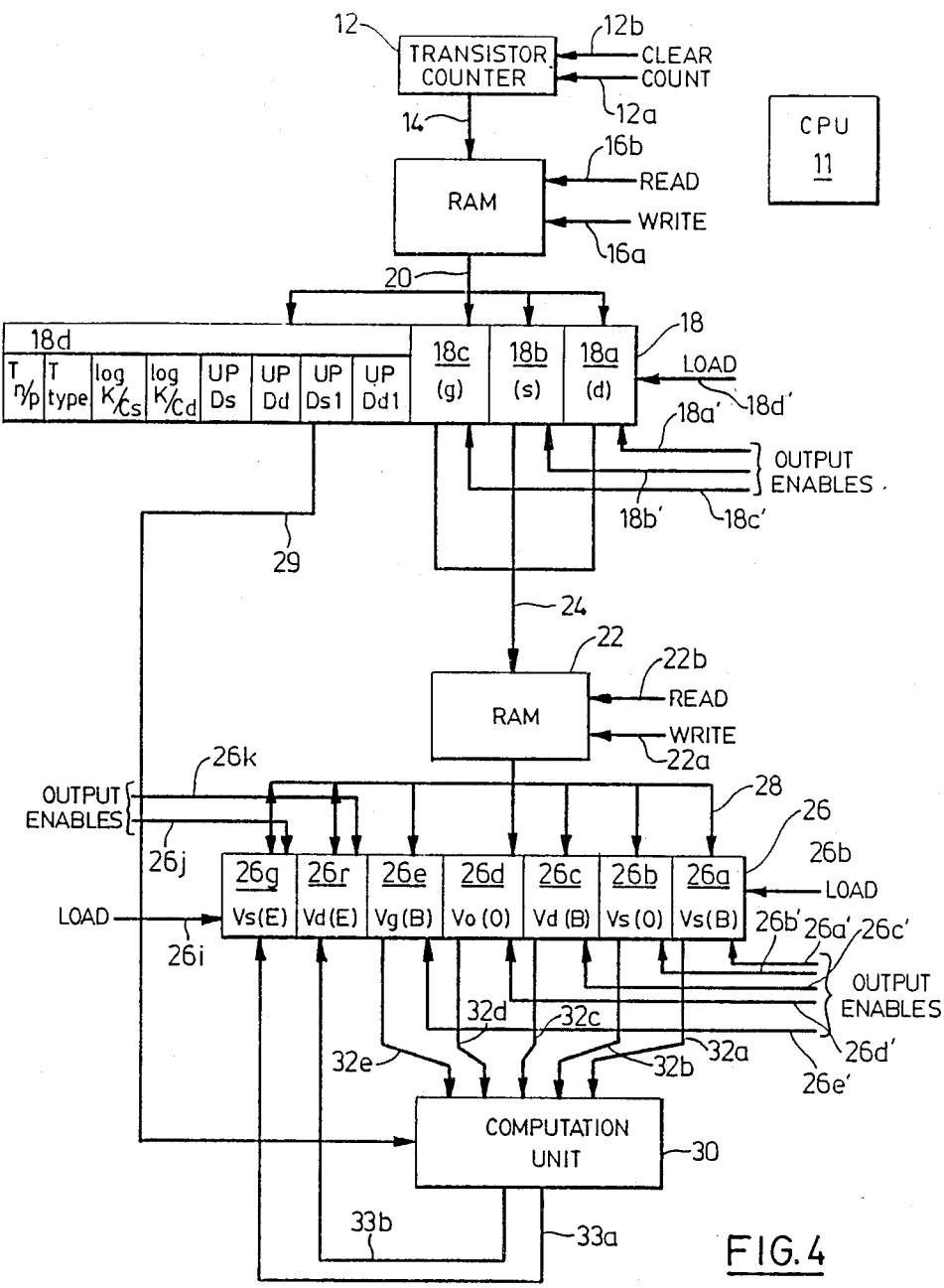
FIG. 4 is a more detailed schematic view of the apparatus.

FIG. 4 illustrates further features of the simulation apparatus 10 including a central processing unit 11 which issues "control" signals to the apparatus components so as to control sequencing. Counter 12 receives a "count" input on control line 12a to advance the transistor count in a particular time step and a "clear" input on control line 12b to reset the transistor count at the end of the time step. First memory 16 is of the RAM type and receives a "write" input on control line 16a enabling transistor identification data to be entered in a particular address, when compiling look up Table 1, and a "read" input on control line 16b to enable transistor characteristics at a particular address to be issued on bus 20.

First register 18 is portioned to provide four fields, three of which, namely 18a to 18c, are assigned to the address of each of the g,s and d nodes. The fourth field 18d is assigned to the remaining characteristics of the identified transistors, namely: Tn/p, Ttype, log (K/Cs), log (K/Cd), UPDs, UPDd, UPDs1, and UPDd1.

First register 18 receives a "load" input on control line IBa' enabling register to load the transistor characteristics on bus 20. First register also receives "output enable" inputs on control lines 18a', 18b' and 18c' which cause first register 18 to issue the address of each of the g,s and d nodes on address bus 24, which are received by second memory 22 storing the voltages at each of the nodes. The transistor characteristics registered in fourth field 18d are conveyed via data bus 29 to computation unit 30. Second memory 22 is also of the RAM type and receives "write" input on control line 22a enabling nodal voltage data to be entered in a particular address and a "read" input on control line 22b to enable the nodal volt ages at the particular address to be issued on data bus 28.

Second register 26 receives inputs from the data bus 20 which are directed to various partitioned fields. Four of the fields register Vs and Vd. Fields 26a and c register Vs(B) and Vd(B) respectively, namely the source and drain voltages at the beginning of the time step.

Fields 26b and d register Vs(0) and Vd(0) respectively, which are governed by the following:

(i) At the first time step, Vs(0)=Vs(B), Vd(0)−Vd(B). This is due to the fact that no previous simulations have occurred so that the volt age at the end of time step is defaulted to equal the voltage at the beginning of time step.

(ii) at subsequent time steps, V(0)=Vs(E), Vd(0)=Vd(E).

A fifth field 26e registers Vg(B), the gate voltage at the beginning of time step.

The register 26 also has sixth field 26f and seventh field 26g to register Vs(E) and Vd(E), the respective source and drain voltages at the end of time step, which are received from the computation unit 30, as will be described. Each of fields 26a to 26e have an associated data bus 32a to 32e in to which second register 26 issues the respective data upon output enable inputs from control line 26a' to 26e'. The data on data buses 32a to 32e is subsequently received by computation unit 30, as will be described. At the end of time step, the computation unit issues outputs on data bus 33a and 33b pertaining to Vs(E) and Vd(E), which are subsequently registered in fields 26f and 26g respectively, upon a "load" signal issued to the second register 26 on control line 26i. The second register also receives "output enable" inputs on control lines 26j and 26k which cause sixth and seventh fields 26f and 26g respectively to issue Vs(E) and Vd(E) on data bus 28 for storage in second memory 22.

The various elements of the computation unit 30 will now be described with reference to FIG. 5. A major portion of the computation unit 30 is identified at 31 as a calculation unit to which comparative reference will be made in a later discussion of another embodiment.

Figure 5:
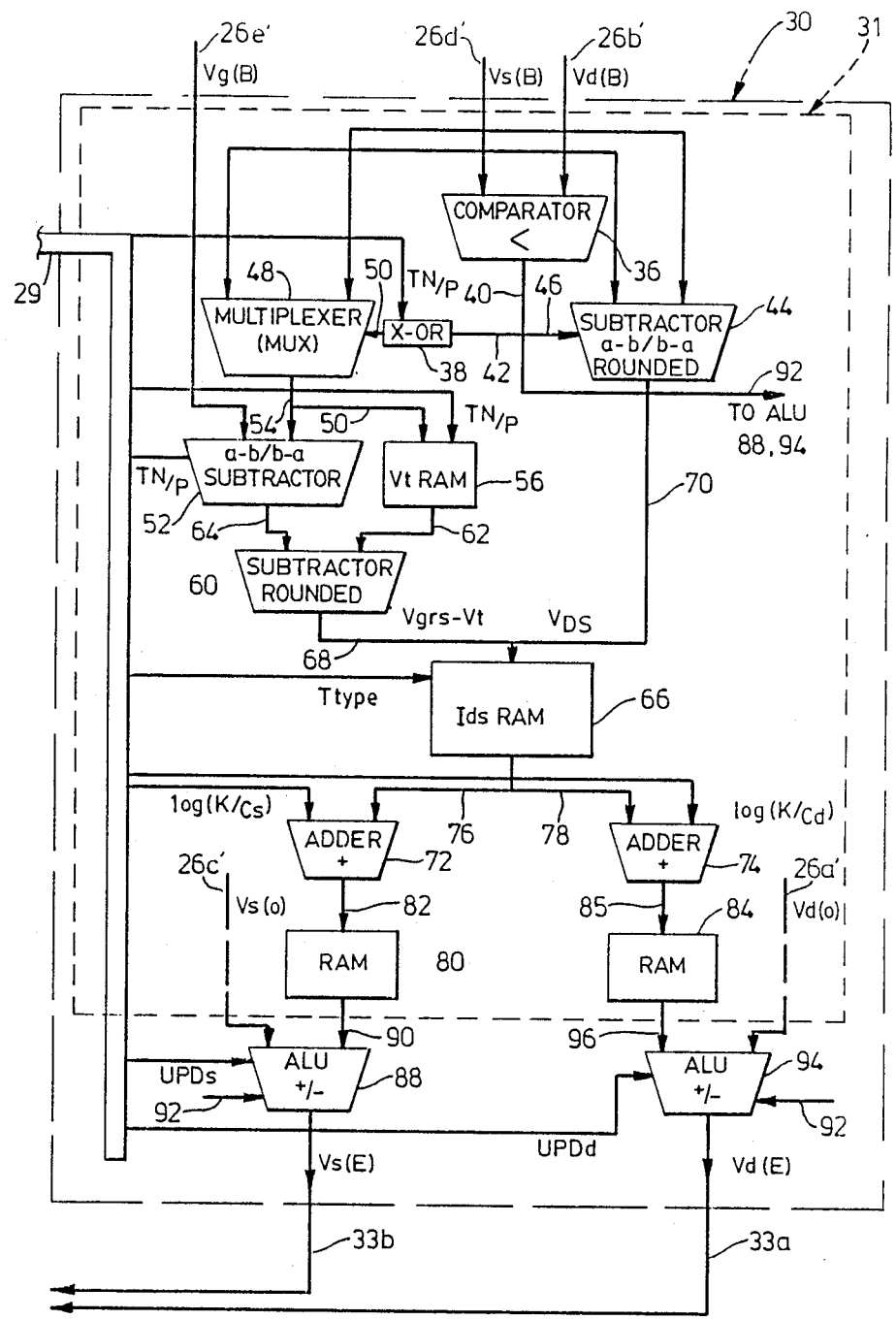
FIG. 5 is a schematic view of one of the components shown in FIG. 3.

The step of determining the direction of current is performed by comparator 36 shown in FIG. 5 which receives Vs(B) and Vd(B) as inputs from data buses 26d' and 26b' respectively. Comparator 36 conveys a "high" or "low" signal, depending on the direction of current, to X-OR gate 38a via conductor 40, 42. X-OR gate 38 also receives a Tn/p input signal from data bus 29 and yields a corresponding "high" or "low" signal, identifying the type of transistor being simulated. The output of comparator 36 is also conveyed to first subtractor 44 via conductor 40, 46, which also receives Vs(B) and Vd(B) inputs from data buses 26d' and 26b' respectively for determining Vds. The output of comparator 36 is also indicative of whether Vds is positive or negative and provides the absolute value of Vds to be generated by first subtractor 44.

The transistor type identification output of X-OR gate 38 is conveyed to multiplexer 48 via conductor 50, multiplexer 48 also receiving Vs(B) and Vd(B) inputs from data buses 26d' and 26b' for identifying the real source voltage, namely Vrs. The output Vrs of multiplexer 48 has a voltage corresponding to Vrs and is conveyed to a second subtractor 52 via conductor 54, the second subtractor 52 also receiving the Vg(B) input from data bus 26c' for determining the gate-real source voltage difference, namely Vgrs. Second subtractor 52 further receives a "high" or "low" Tn/p input signal from data bus 29 indicating whether Vg−Vrs or Vrs−Vg is performed in determining Vgrs.

The output Vrs of multiplexer 48 is also conveyed to a third memory 56 via conductor 54, 58, third memory 56 also receiving a Tn/p input signal from data bus 29. Third memory 56 stores values of Vt depending on the variables Vrs and Tn/p, which enable third memory 56 to identify a particular Vt. The value of Vt is then conveyed by third memory 56 to a third subtractor 60 via conductor 62 which also receives a Vgrs signal from second subtractor 52 via conductor 64. Third subtractor 60 generates the voltage difference (Vgrs−Vt) which is conveyed to a fourth memory 66 via conductor 68. Fourth memory 66 also receives a Vds signal from first subtractor 44 via conductor 70 and a T-type signal from data bus 29. Fourth memory 66 stores the values of Ids as a particular function of the input variables, namely (Vgrs−Vt), Vds, and as a function of the type of transistor being simulated. In other words, fourth memory is partitioned into a predetermined number of sectors, each sector storing values of Ids' dependent on a particular transistor model. In the present case, only one transistor model is being considered, therefore requiring only one sector to be defined in fourth memory 66. Furthermore, the Ids' values are stored in logarithmic notation in order to provide uniform accuracy while reducing the memory size in comparison with linear representation.

The output of fourth memory 66, namely log Ids', is conveyed to adders 72 and 74 via conductors 76 and 78 respectively. Adder 72 also receives an input from second register 26, namely log (k/Cs), and adds the two inputs to generate the logarithmic value of the change of voltage at the source node, namely log (delta) Vs.

Similarly, adder 74 receives an input from second register 26, namely log (k/Cd) and adds the two inputs to generate log (delta) Vd.

The respective outputs of adder 72 and 74 are conveyed to fifth memory 80 via conductor 82 and sixth memory 84 via conductor 85. Fifth memory 80 serves as an exponential generator to produce (delta) Vs in linear representation. Likewise, the output of adder 72 is conveyed to sixth memory 84 via conductor 86 for producing (delta) Vd in linear representation.

The (delta) Vs output of fifth memory 80 is conveyed to arithmetic logic unit 88 (ALU) via conductor 90. ALU 88 also receiving a Vs signal and a UPDs signal from data bus 29. In addition, ALU 88 receives a signal from comparator 36 via conductor 40, 92 pertaining to the additive or substractive sense to be assigned to delta Vs as a result of the direction of current Ids. If the UPDs signal indicates that the source node is not connected to a source or common ground, ALU 88 produces a signal pertaining to Vs(E) which is conveyed to second register 26 via conductor 33a. Otherwise, if UPDs signal indicates that the S node is connected to a source or ground, then (delta) Vs is disregarded, making Vs(E)=Vs(B).

Likewise, the (delta) Vd output of sixth memory 84 is conveyed to ALU 94 via conductor 96, with ALU 94 issuing a signal pertaining to Vd(E). This value also depends on the direction of current Ids and the UPDd signal and is conveyed to second register 26 via conductor 33b.

Each of the adjusted Vd and Vs values is conveyed by second register 26 to second memory 22 where it is stored. The adjusted voltage at shared nodes. such as node 1 in the example circuit are updated after the simulation of the adjacent transistor and adjusted according to the voltage change generated by the current Ids of the adjacent transistor. The operation of the analogue simulator is best understood by considering again the example circuit of FIG. 1, containing n-channel transistors to which is assigned the following variables by way of example:

For transistor T0 -
k0=30
Cs=100
Cd=1
For transistor T1 -
k1=20
Cs=2
Cd=1

To start the simulation procedure, counter 12 is enabled to identify the first transistor namely T0, after which memory 16 is enabled to access the characteristic values of T0. These are seen in first register 18 as follows:

| Log k/Cs | Log k/Cd | g | s | d | UPDs | UPDd | UPDs1 | UPDd1 | Tn/p |
|---|---|---|---|---|---|---|---|---|---|
| −.523 | 1.477 | 3 | 0 | 1 | 0 | 1 | 1 | 1 | 1 |

Since the arbitarily chosen source node is connected to a common ground, a logic "low" signal is registered in UPDs. The UPDd signal is a logic "high" since the arbitrarily chosen drain node is not connected to a voltage source. The UPDs1 and UPDd1 signals are also logic "highs" since both the arbitrarily chosen source and drain nodes are being updated for the first time. The Tn/p signal is a logic "high" signal indicating that T0 is an n-channel transistor.

With the characteristic values of T0 registered in register 18, controller 11 enables second memory 22 to identify the gate, source and drain voltages. Second memory 22 stores the voltages for each node in the "before" column as follows by example:

TABLE A

|   | B | E |
|---|---|---|
| 0 | 0 | 0 |
| 1 | 3 |   |
| 2 | 5 | 5 |
| 3 | 5 |   |
| 4 | 5 | 5 |

(Thus Vg = 5, Vs = 0 and Vd = 3)

Since T0 is not connected to nodes 0,2 and 4, the voltages of these nodes will not change during the simulation of T0. Accordingly, the voltages for nodes 0,2 and 4 are set by the controller 11 in both the "before" and "end" columns.

The second memory 22 is then enabled by controller 11 to issue the voltages for the gate, source and drain nodes on data bus 28, while second register 26 is enabled to receive the data in fields 26a to e. The second register 26 then issues the voltages on respective data buses 32a to e. The computation unit 30 then makes the necessary calculations to determine the direction of current, to identify the real source and to perform the various steps leading up to the calculations of delta Vs and delta Vd in the following sequence:

(1) comparator 36 determines the direction of current by comparing the values of Vs and Vd namely Vs=0 and Vd=3. Since Vd is greater than Vs the current is thus flowing from Vd to Vs and conveys a logic "high" signal indicative of current direction to each of first subtractor 44 and multiplier X-OR gate 38.

(2) X-OR gate 38 receives the logic "high" Tn/p signed, thereby identifying an n-channel transistor and conveys such information to the multiplexer 48, in the form of a logic "low" signal.

(3) multiplexer 48 identifies the real source, which in this case is the arbitrarily chosen source node, that is, Vs=Vrs.

(4) subtractor 52 determines the difference between Vg and Vrs, namely 5−0=5 volts.

(5) simultaneously with step 4, third memory 56 issues the corresponding threshold voltage Vt, namely Vt=0.5 volts (chosen arbitrarily for the present example).

(6) third subtractor 60 determines the difference between Vgrs and Vt, namely 5−0.5=4.5 volts.

(7) simultaneously with steps 3, 4, 5 and 6, first substractor 44 determines the difference between Vd and Vs, namely Vds=3−0=3 volts.

(8) fourth memory 66 issues the logarithmic value of Ids, namely log Ids' as dependent on the variables (Vgrs−Vt) and Vds, namely, (4.5, 3), Ids' being identified as 0.1 for the present example. Therefore, fourth memory produces log (0.1)=−1.

(9) adder 72 determines the sum, log (k/Cs)+log Ids' namely (0.523)+(−1). Therefore log (delta) Vs=1.523.

(10) Fifth memory 80 determines and exponentiates the value of log (delta) Vs, namely (delta) Vs=0.030.

(11) ALU 88 defaults the (delta) Vs value to zero in accordance with the UPDs signal. Thus the adjusted value of Vs, namely V's0 remains unchanged at V's0=0.

(12) In equivalent manner and simultaneous to step 9 adder 74 determines log (delta) Vd=0.477 volts.

(13) Simultaneous to step 10, sixth memory 84 determines the value of log (delta) Vd namely (delta) Vd=2.99.

(14) Simultaneous to step 11, ALU 92 assigns a substractive sense to (delta) Vd and determines the adjusted value of Vd, namely V'd0=Vd0−(delta) Vd0=3−2.99=0.01.

(15) The V's0 and V'd0 signals are is transferred to second memory 22 via register 26. Consequently, memory 22 stores the "adjusted" voltages at the end of the transistor T0 simulation in the "end" column as follows:

TABLE B

|   | B | E |
|---|---|---|
| 0 | 0 | 0 |
| 1 | 3 | 0.01 |
| 2 | 5 | 5 |
| 3 | 5 | 5 |
| 4 | 5 | 5 |

In subsequent transistor simulation during the first time step, nodal voltages changes are determined on the basis of initial nodal voltages as found in the "before" column, while accumulation of nodal voltage changes are made with reference to the adjusted voltages registered in the "end" column.

With transistor T0 simulated for the first time step, counter 12 identifies transistor T1 the characteristics of which are seen in first register 18 as follows:

| Log K/Cs | Log K/Cd | g | s | d | UPDs | UPDd | UPDs1 | UPDd1 | Tn/p |
|---|---|---|---|---|---|---|---|---|---|
| 1 | 1.301 | 4 | 2 | 1 | 1 | 1 | 1 | 0 | 1 |

In this instance, the UPDs1 signal is a logic "high" since the source node 2 is being updated for the first time. The UPDd1 signal, on the other hand, is a logic "low" since the drain node 1 is being updated for the second time. The simulation procedures now repeated with second memory identifying the nodal voltages from the "Before" column.

Vg1=5
Vs1=5
Vd1=3

Therefore, Vds1=31 2

Now, assuming Ids to be 0.3 in this case we find that (delta) Vs=0.5 and (delta) Vd=1.0. The adjusted voltages are then found to be:

V'g1=5
V's1=4
V'd1=2.5

The adjusted voltages for T1 are accordingly substituted in the "End" column as follows:

TABLE C

|   | Beginning | End |
|---|---|---|
| 0 | 0 | 0 |
| 1 | 3 | 2.5 |
| 2 | 5 | 4 |
| 3 | 5 | 5 |
| 4 | 5 | 5 |

With the simulation being complete for the first time step, the following steps are performed:

(i) The roles of the "before" and "end" values are reversed, thereby causing the end of time step values to be used as the beginning of time step values for the next time step.

(ii) The counter identifies the first transistor T0 thereby repeating the simulation procedure and advancing the time step by one normalized unit.

It is to be understood that conventional control logic is required to implement the simulation sequence while various data and address buses are needed to carry transistor and nodal information throughout the apparatus. Such features have not been described in detail for the sake of brevity and are considered well known.

Also not shown are the communication channels with central processing unit 11 which accesses the various memories of the circuit for manipulating the simulation data to user readable and analytical form as it is believed to be well known to those skilled in the art.

The simulation apparatus illustrated in FIGS. 2 to 5 is particularly suitable for circuits having up to a few tens of thousands of circuit elements. However, the computational speed of the above-mentioned apparatus may be too slow for effective simulation of circuits having more than sixty-four thousand transistors. To facilitate the simulation of circuits of this size an alternative simulation apparatus 99 as illustrated in FIGS. 6, 7, 8 and 9 is implemented. As will be described, the device 99 increases the computational speed of the circuit simulation being performed by simulating only those transistors and nodes in the circuit which are active in a previous time step $t_{k-1}$. In addition, a plurality of processor stages 100 are utilized in the apparatus 99 in order that a number of circuit elements can be simulated simultaneously.

Figure 6:
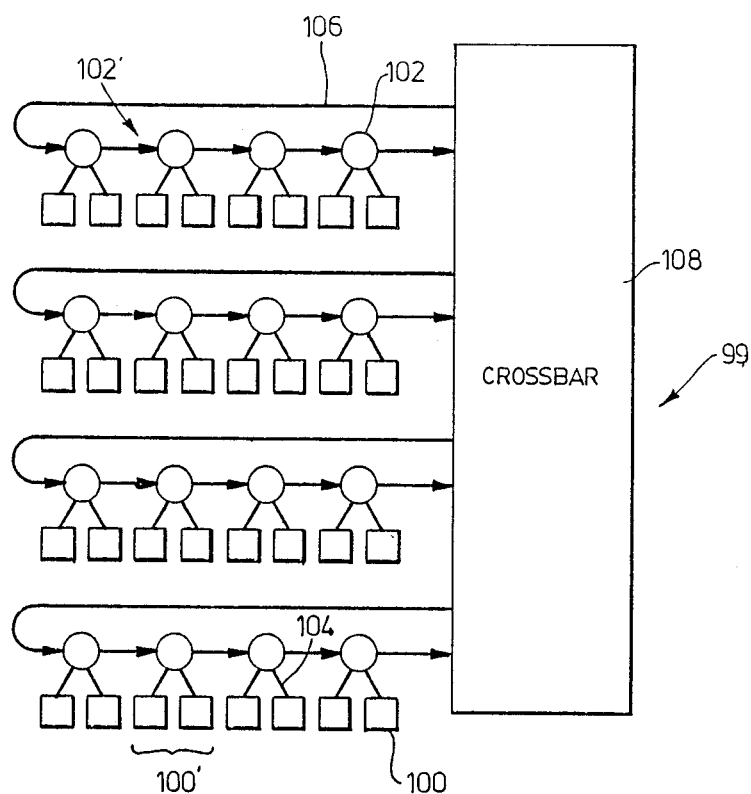
FIG. 6 is a schematic view of an alternative apparatus.

Referring now to FIG. 6, the apparatus 99 is shown having a plurality of processor stages 100 each assigned to a particular segment of the circuit being simulated. The processor stages 100 are grouped into pairs 100', with each pair 100' communicating with a network controller 102 by a way of a respective communication channel 104. The network controllers 102 are arranged into groups 102' of four, each group 102' of which communicates directly with the other three groups via a circular data channel 106 and a cross-bar 108. The cross-bar 108 receives each of the circular data channels 106 and allows a communication link between each of the groups 102' to be established, thereby enabling intercommunication between each of the processor stages 100. The cross-bar 108 is a typical networking bus, which is known in the art and has a protocol, which facilitates the communication process between each group 102' and ensures that the data transferred therebetween is correct and does not interfere with other data transmissions.

Figure 7:
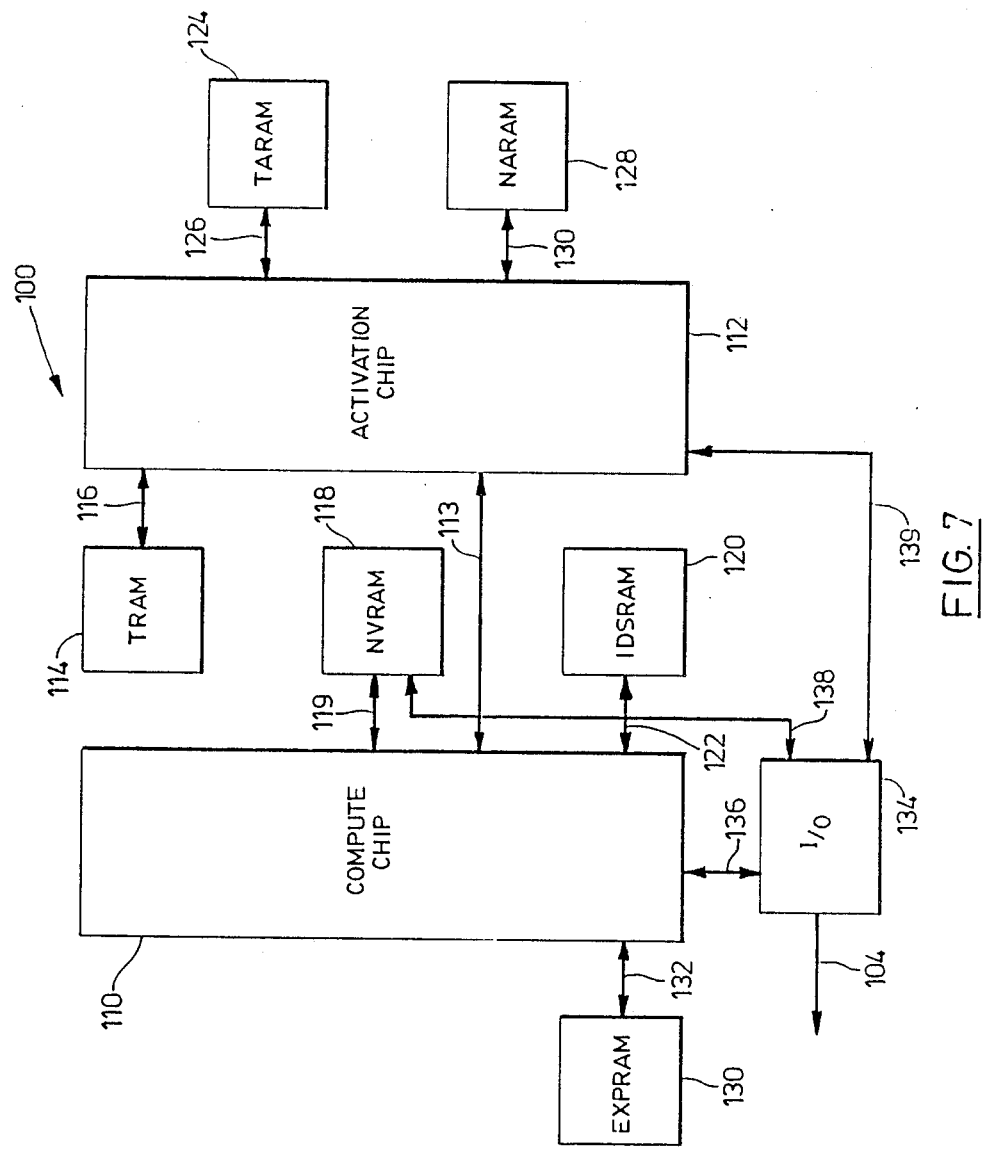
FIG. 7 is a schematic view of one element of the apparatus in FIG. 6.

The structure of each processor stage 100 is illustrated in FIG. 7 and includes a compute chip 110 which determines the voltage changes at the nodes of each element in the circuit that is being simulated in an equivalent manner to the analysis carried out in the previous embodiment. An activation chip 112 is also provided which communicates with the compute chip 110 via channel 113 and operates simultaneously therewith to evaluate the voltages at the respective nodes being analyzed by the compute chip 110, as well as the latency of these nodes and the transistor element of the circuit that is connected to them. As will be explained, the voltage and latency information is tabulated to detect the inactive nodes in the circuit being analyzed in one time step $t_k$ such that these nodes will not be simulated in the subsequent time step $t_{k+1}$.

Similar to the previous embodiment, a plurality of RAM memories are utilized in the device 99 to store circuit and simulation data. A transistor memory or "T" RAM 114 is provided and is coupled to the compute and activation chips 110 and 112 respectively by way of a communication channel 116. The "T" RAM 114 stores a list of the transistor elements found in the circuit that the processor stage 100 is to simulate and the nodes in the circuit to which each transistor element is coupled.

A node voltage memory or "NV" RAM 118 is also included and communicates with the compute chip 110 by way of conductor 119 which stores a list of the voltages at each of the nodes of the circuit as well as a list of the transistor elements coupled to each node. The "NV" RAM 118 also stores an identification list for those nodes in the circuit which are also being referenced in a subsequent processing stage 100. Each list contains a list of those subsequent processing stages 100 that will be using the voltage appearing on the particular node when simulating their respective segments of the circuit. In addition, the list includes an address for the location in the "NV" RAM of the particular processor where the nodal voltage information for that node is to be stored. Thus, updated voltage values for those nodes having an identification list are conveyed by the processing stage 100 to the subsequent processing stages listed at the end of each simulation step. This transfer of information between each of the processor stages 100 ensures a correct circuit simulation since each processor stage 100 receives updated information at the end of each simulation step. This transfer of information between each of the processor stages 100 ensures a better circuit simulation since each processor stage 100 receives updated information at the end of each simulation step.

A drain to source current memory or "IDS" RAM 120 is included which stores values of the typical drain to source currents IDS of a transistor when supplied with different voltage values Vs and Vg-Vt in a similar manner as in the previously described embodiment. The "IDS" RAM 120 is coupled to the compute chip 110 by way of conductor 122 thereby allowing the transfer of the current information to the compute chip 110.

An exponential memory or "EXP" RAM 130 is also provided which serves as an exponential value generator to facilitate the calculation of the (delta) Vs and (delta) Vd voltage values by the compute chip 110 as in the previous embodiment.

A transistor activation memory or "TA" RAM 124 stores transistor activation bits $TA_k$ and $TA_{k+1}$ for the present time step $t_k$ and next simulation step $t_{k+1}$; respectively, and exchanges these bits of information with the activation chip 112 by way of communication channel 126. A node activation memory or "NA" RAM 128 is also coupled to the activation chip 112 via conductor 130 and stores node activation bits $NA_{k-1}$, $NA_k$ and $NA_{k+1}$ for the past, present and future simulation steps $t_{k-1}$, $t$ and $t_{k+1}$ respectively as well as a fan-out list $FO_i$ for each node i. The transistor and node activation bits each comprise a single bit, a logic "high" value of which indicates to the processor stage 100 that the simulation of the nodes on the transistor element should occur in the time step associated with the node activation bit. The fan-out list includes those nodes that must be simulated in the next time step $t_{k+1}$ if the voltage of node i changes during the present time step $t_k$.

Finally, an "I/O" input/output section 134 transfers information to and from the network controller and communicates with the compute chip via channel 136 and with the "NV" RAM 118 via channel 138 and the activator chip via channel 139.

Figure 8A:
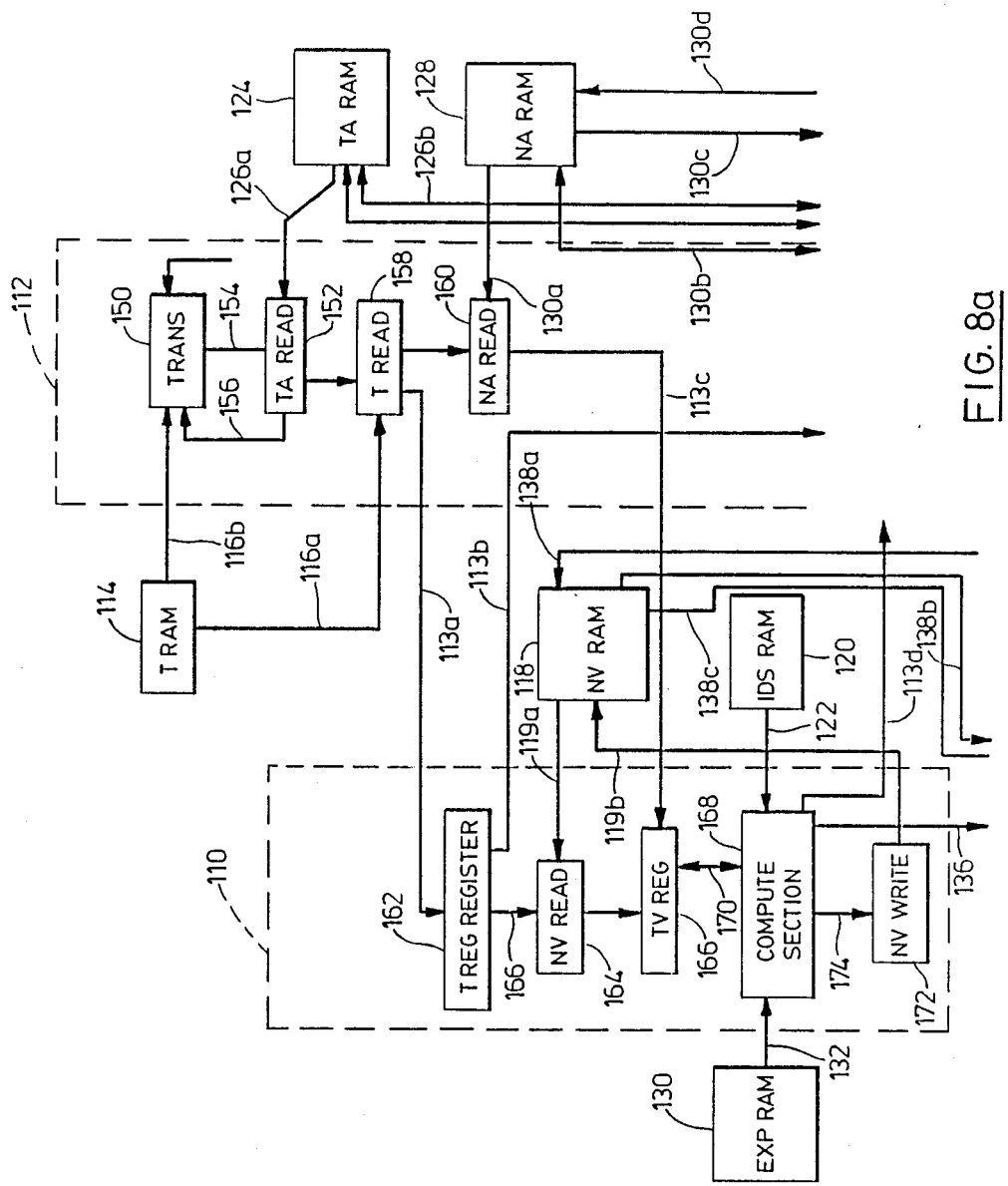
FIGS. 8a and 8b are schematic views, in further detail, of the element illustrated in FIG. 7.
Figure 8B:
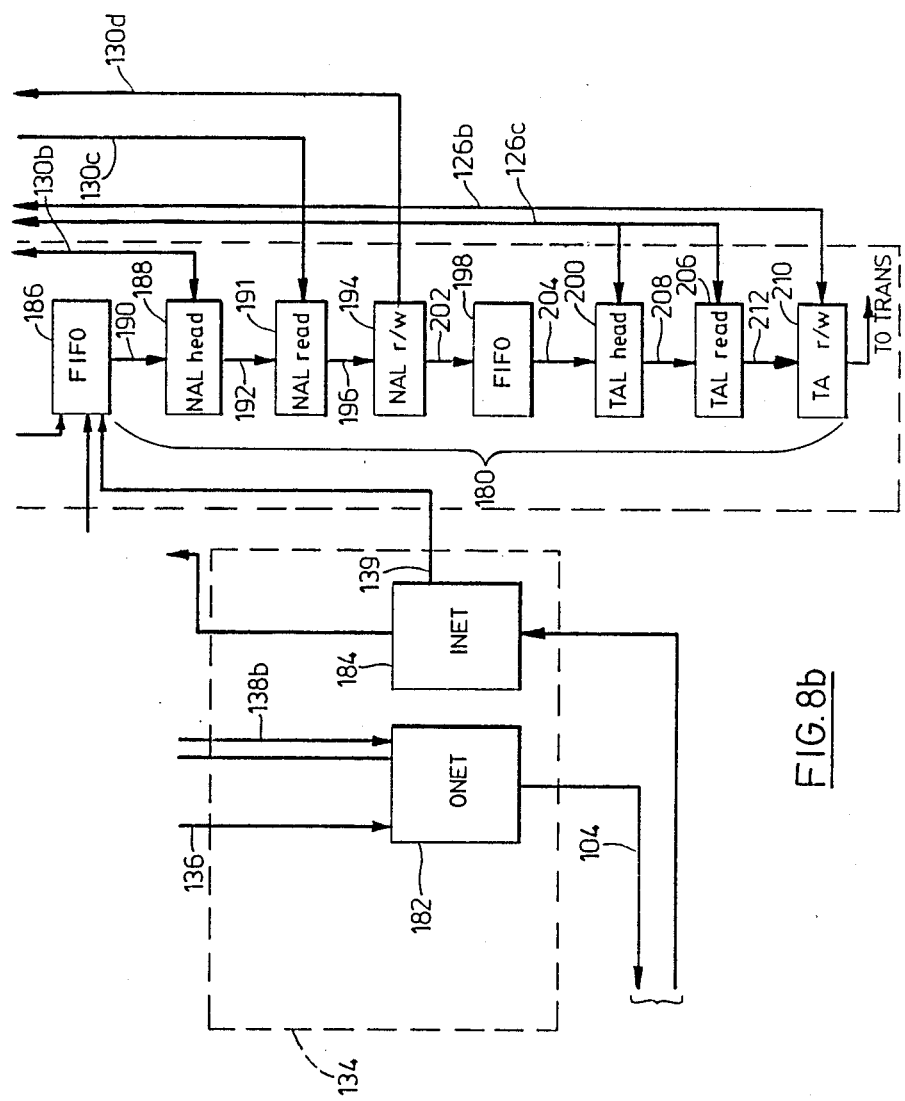
Figure 9:
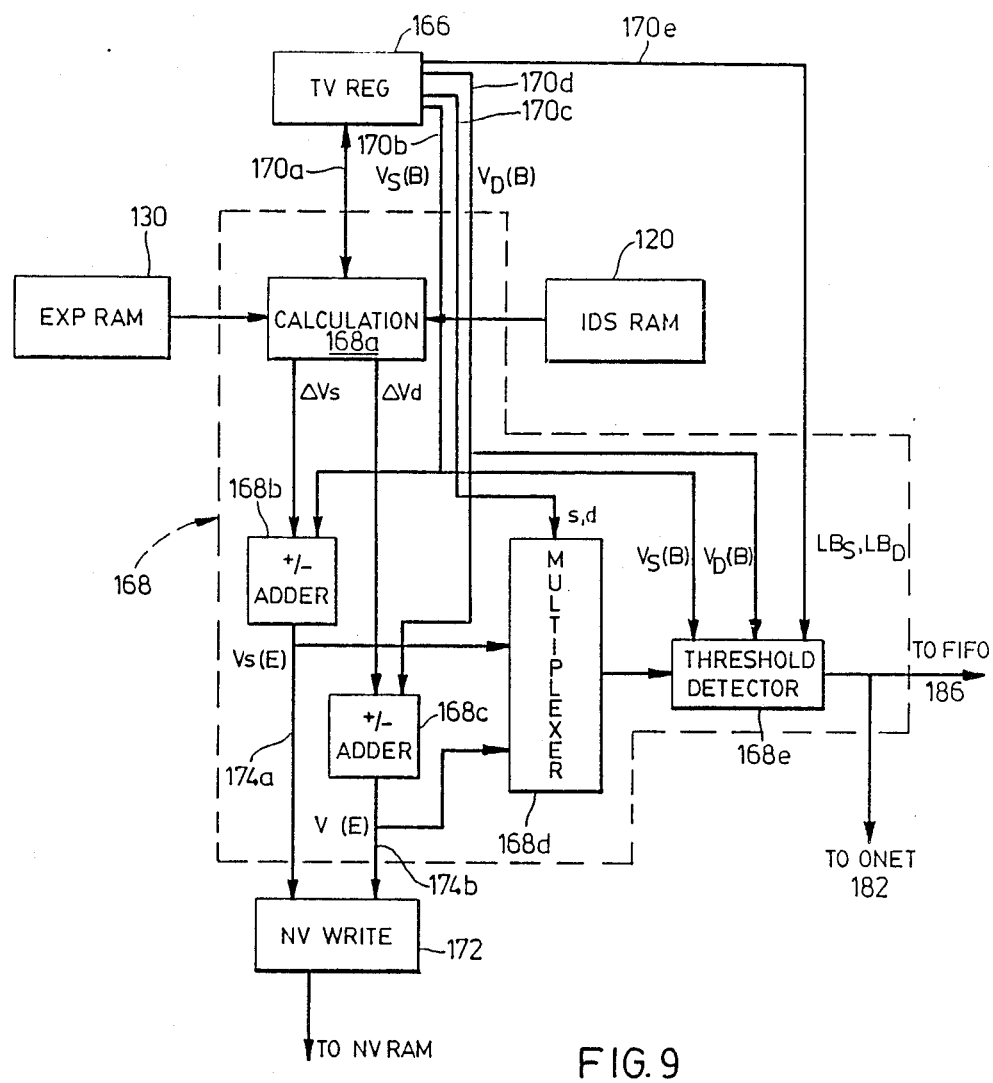
FIG. 9 is a schematic view of one component of the element, illustrated in FIG. 8.

A more detailed functional diagram of the processor stage 100 is illustrated in FIGS. 8a, 8b and 9. The activation chip is shown at 112 and comprises a transistor identification "TRANS" section 150 which is coupled to the "T" RAM 114 and receives the transistor and node voltage information associated with the transistor element being simulated. Receiving the output from the "TRANS" section 150 is a transistor "TA" READ section 152 via conductor 154 and which also retrieves the transistor activation bit for the transistor element from the "TA" RAM 124. The "TA" READ section 152 communicates with the "TRANS" section 150 via conductor 156 to advance to another transistor in the presence of a latent transistor element. A "T" READ section 158 communicates with both the "TA" READ section 152 and the "T" RAM 114 to obtain the characteristics of the transistor element being simulated, namely g, s, d, k/Cs, k/Cd, Tn/p, T/type, UPDs, UPDd as in the previous embodiment. In addition, several other transistor characteristics are provided, namely:

$I/O_S$-Input/output source bit
$I/O_S$-Input/output drain bit

These characteristics indicate the presence of an identification list for the node being simulated, and therefore the need to distribute the end of time step voltage to the appropriate processing sections, as will be described; and $LB_S$-"Last" bit for source node
$LB_D$-"Last" bit for drain node These characteristics indicate when the final transistor element connected to a particular node has been simulated, to enable the latency of the node and its associate element to be ascertained.

The "T" READ section 158 conveys an output to the compute chip 110 via conductor 113a as well as to a node activation "NA" READ section 160. The "NA" READ section 160 also receives node activation information from the "NA" RAM 128 and conveys the information to the compute chip 110 via conductor 113c so that the proper nodes are analyzed when simulating the transistor element.

Located in the compute chip 110 and receiving the transistor information from the "T" READ section 158 is a transistor "T" register 162. The output of the "T" register 162 is conveyed to a node volt age "NV" READ section 164 via conductor 166 which also receives the node voltage information from the "NV" RAM 118 via conductor 119a. The "NV" READ section 164 is coupled to a transistor voltage "TV" register 166 which also receives the output from the "NA" READ section 160 via conductor 113c. Thus, the "TV" register 166 stores the voltages at the nodes of the transistor element being simulated and conveys this information to a computation section 168 via conductor 170. The computation section 168 functions in the same manner to the computation unit described in the previous embodiment and similarly receives information from the "IDS" RAM 120 and the "EXP" RAM 130. Also, in accordance with the previous embodiment, the computation section conveys $V_S(O)$, $V_D(O)$ to "TV" register 166.

The computation section 168 generates several outputs, two of which are $V_s(E)$, $V_d(E)$ corresponding to the respective voltages of the source and drain node and a pair of status bits, $SB_s$, $SB_d$, one for each of the source and drain nodes. The $V_s(E)$, $V_d(E)$ outputs are conveyed to an "NV" WRITE section 172 via conductor 174 which in turn is linked to "NV" RAM 118 via conductor 119b in order to update the "NV" RAM 118 with these values. The status bits are conveyed to a pipeline 180 via conductor 113c located in the activation chip 112 to allow the other values stored in the "NV" RAM 118, the "NA" RAM 128 and the "TA" RAM 124 to be updated. The computation section 168 transfers the status bit information to an ONET 182 within I/O section 134 via conductor 136, which in turn is coupled to the communication channel 104. The ONET also receives the identification list for the transistor being simulated and the $V_s(E)$, $V_D(E)$ values stored in the "NV" RAM and conveys this data to the appropriate processor stages 100 in the device 99. Also coupled to the channel 104 is an INET 184 which, upon reception of timing pulses from an external clock receives updated node voltage information from other processor stages 100 performing circuit simulations.

The pipeline 180 comprises a first in/first out register FIFO 186 which receives node information from the "T" register 162 via conductor 113b and the computation section 168 via conductor 113c. The output from the FIFO 186 is applied to a node activation list "NAL" HEAD section 188 by conductor 190 which in turn communicates with the "NA" RAM 128 via conductor 130b in order to retrieve the location of node fan-out list $FO_i$ associated with each node of transistor element being simulated. This is conveyed to a node activation list "NAL" READ section 190 via conductor 192 which examines the fan-out list $FO_i$. The output of the "NAL" READ section 190 is applied to a node activation list read/write "NAL R/W" section 194 via conductor 196 where the node activation bits NA are updated according to the status bits as will be described. The "NAL R/W" section 194 also supplies information to a first in/first out (FIFO) register 198 which in turn conveys the data to a transistor activation list "TAL" HEAD section 200 via conductor 202, 204 respectively. The "TAL" HEAD section 200 uses this data to retrieve location of the fan-out list $FO_i$ for the transistor being simulated, from the "TA" RAM 128 via conductor 126c. The location of the fan-out list and transistor node information are conveyed to a transistor activation list "TAL" READ section 206 via conductor 208, which also receives the fan-out list from the "TA" RAM 124 associated therewith. The information therein is compared and the results are conveyed to a transistor activation list read/write "TAL R/W" section 210 via conductor 212. If required, the transistor activation bits stored in the "TA" RAM 124 are updated in accordance with the status bits for the simulation transistor by way of "TAL R/W" section 200 on conductor 126b. The "TAL R/W" section 200 is also linked with the "TRANS" section 150 to register the completion of the simulation for the transistor element.

Looking at the computation section 168 in more detail, in FIG. 9, the section includes a calculation section 168a which functions in a similar manner to calculation unit described in the previous embodiment to determine (delta) $V_s$ and (delta) $V_d$. The (delta) $V_s$ and (delta) $V_d$ outputs are respectively coupled to a pair of adders 168b and 168c which also respectively receive the the values $V_s(O)$, $V_d(O)$ held in the "TV" register 166, as in the previous embodiment. The results, $V_s(E)$ and $V_d(E)$ are conveyed to a multiplexer 168d, which receives source and drain node identifier information from "TV" register 166 via conductor 170c, and successively channels the voltages to a threshold detector 168e. The threshold detector 168c also receives $LB_S$, $LB_D$ inputs as well as $V_s(B)$, $V_d(B)$ inputs from the "TV" register 166 from conductors 170e, 170b and 170d respectively.

The threshold detector 168e in turn generates an output indicative of a voltage value above or below the threshold. This output is conveyed to FIFO 186 of the pipeline 184, which also receives an input from "TV" register 166 via conductor 170c indicating whether the node is either the source or drain of the transistor element being simulated. The output from the threshold detector is also conveyed to the ONET 182 indicating that the other processors, in the identification list are to be updated with the respective new voltage value $V_S(E)$ or $V_S(B)$. The outputs $V_s(E)$ and $V_d(E)$ are also conveyed to the node voltage "NV" WRITE section 172 via conductors 174a, 174b which conveys the updated node voltages to the "NV" RAM 118.

The operation of each of the elements in the processor stage 100 is controlled by a pulse generated by the external clock (not shown), and which initially activates the "TRANS" section to select a transistor element to be simulated.

The external clock drives the ONET 182 and INET 184, both of which include an 8-bit register coupled to the communication channel 104, and which allows the register to exchange updated node voltages conveyed thereto with a different processing stage 100. Thus, upon reception of five pulses the external clock, the INET 184 allows 8-bit strings of data to be entered into the device 99, thereby allowing a 40-bit data stream to be received during each simulation time step $t_k$, while the same five pulses allows a 40 bit word to be conveyed by the ONET 182.

To obtain information from another processing section, the INET 184 receives a 40-bit stream of data which is conveyed to the "NV" RAM 118 via conductor 138a and to the pipeline 184 via conductor 139 and used to update the node volt age values and the associated activation bits stored in the memories of the processor stage 100, so that the updated node voltage values can be used during the $t_{k+1}$ time step. Again, this exchange is seen in the form of eight bit strings, one of which is passed at every clock pulse, thereby requiring five such pulses to complete the exchange.

Upon reception of the appropriate clock pulse the "TRANS" section 150 begins to retrieve the first transistor element information and the node information to which the transistor is coupled so that the first element in the circuit can be simulated. The transistor identification "TRANS" section 150 applies the transistor element and node information to the "TA" READ section 156 which also receives the transistor activation bit from the "TA" RAM 124. The "TA" READ section 156 examines the transistor activation bit and applies an increment pulse to the "TRANS" section 150 if the transistor activation bit is detected as being low, thereby signalling to the activation chip 112 that the first transistor element is inactive, and should not be simulated. Upon reception of this pulse, the next transistor element of the circuit is retrieved in a similar manner.

If the transistor activation bit is detected as being "high", the transistor element and node information is conveyed to the "T" READ section 158 which in turn retrieves the transistor element characteristics for the transistor element being simulated, from the "T" RAM 114. The "T" READ section 158 in turn conveys this information to the transistor "T" register 162 wherein the information is stored, while the node identifiers g, s and d are conveyed and to the "NA" READ section 160. The "NA" READ section 160 then retrieves the node activation bits associated with these nodes from the "NA" RAM 128 and conveys this information to the "TV" register 166 located in the compute chip 110 wherein it is stored for use by the compute chip 110.

The contents in the "T" register 162 are conveyed to the "NV" READ section 164 which examines the contents of the "T" register 162 and also receives the gate, source and drain node transistor characteristics for the simulated transistor element from the "NV" RAM 118. The node voltages obtained in the "NV" READ section 164 are conveyed to the transistor voltage "TV" register 166 and stored therein. Thereafter, the drain, source and gate node voltages and the node activation bits are conveyed to the computation section 168. The calculation section 168a uses the node voltages to determine the change in node voltages (delta) Vs and (delta) Vd, which are conveyed to associated adders 168b, 168c to generate $V_s(E)$, $V_d(E)$ respectively.

The $V_s(E)$ and $V_d(E)$ signals are conveyed to the multiplexer 168d which successively conveys the signals to the threshold detector. The threshold detector in turn compares the particular value with the beginning-of-time-step voltage for the particular node. However, this is done only if the respective one of the $LB_S$ and $LB_D$ bits is "high", while a "low" signal prevents the comparison for the present clock cycle. In this manner a premature determination of an active node is avoided if, for example, the contribution of each transistor connected therewith effectively balances the other, thereby causing no net change in voltage. Considering the source node as an example, if $LB_S$ is high, then the threshold detector compares $V_s(E)$ with $V_s(B)$. If the difference is less than a preset threshold value, then a "low" status bit is conveyed by the threshold detector to the FIFO 186, indicating to the pipeline that the node being simulated should not be simulated during the next time step. However, if the change in voltage value is greater than the threshold value, a "high" status bit is conveyed to the FIFO register 186 indicating to the pipeline that the node is to be simulated during the next time step. This is then repeated for the drain node.

The respective status bits are conveyed to ONET 182, where a "high" status bit indicates that the ONET is to access "NV" RAM 118 for the end of time step node voltage for the node. The ONET thus distributes the end of time step voltage to each processor listed in the identification list.

The "T" register transistor element information is also conveyed to the first in/first out register 186 from the "T" register 162 in order that pipeline 184 the node and transistor activation bits for those being simulated by the immediate processor can be updated. The FIFO register 186 conveys the information received to the node activation list "NAL" HEAD 188 which retrieves the location fan-out list $FO_i$ associated with the nodes to which the simulated transistor is coupled.

The location of the fan-out list is conveyed to the "NAL" READ section 190 which reads the list to examine the $NA_{k+1}$ bits with the associated status bit. The output of the "NAL" READ section 190 is applied to the "NAL" read/write section 194 which is also coupled to the "NA" RAM 128. The "NAL R/W" section 192 updates the "NA" RAM 128 to activate the $NA_{k+1}$ bit if the status bit is "high", thereby indicating that the node should be simulated in the next time step $t_{k+1}$. Similarly the $NA_{k+1}$ is deactivated if the status bit is low.

The output of the "NAL R/W" section 194 is conveyed to the FIFO register 198. The information from the FIFO register 198 is applied to the transistor activation list "TAL HEAD" section 200 which receives the location of the fan-out list associated with each of the other transistor elements to which the transistor element being simulated is coupled. Upon receiving the locations of fan-out list, the "TAL" READ section 206 reads the transistor activation bit $TA_{k+1}$ associated with the simulated transistor element from the "TA" RAM 124. The "TAL R/W" section 210 then either activates or deactivates the $TA_{k+1}$ bit in the list corresponding to the state of the "status" bits for the source and drain nodes.

Thus, the apparatus 99 enables a significantly large circuit to be simulated by subdividing the circuit into a number of segments and assigning each of those segments to a particular processor. Each processor is, in turn, made up of a number of components, one of which carries out simulations in the present time step, and another which compares the simulations of the transistor elements of the present time step with those simulations of a previous time step to ascertain whether the transistor is latent, and if so, to prevent the simulation of those transistor elements in the next time step. In this manner, a significant increase in simulation speed may be obtained.

The simulation apparatus described herein above is not only capable of simulating VLSI circuits containing FET transistors but also other types including BJT transistors. In the case of BJT transistors, the circuit element is modelled by a combination of an FET transistor with a diode connected across the gate and source nodes.

The present simulation apparatus is also adaptable to simulate resistors in a VLSI circuit and are considered a degenerate form of transistor where $k = 1/R$ and Vgs is ignored. In this case, a Ttype signal in fourth memory 66 accesses a specific region therein which stores resistor currents for resistors having $k = 1$ and dependent on the voltage condition across the resistor. This value of current is then adjusted by taking into account the actual resistance present across the terminals of the resistor and the capacitance associated with each terminal.

I claim:

1. A simulation apparatus to perform analog simulations of an electronic circuit having a plurality of circuit elements, each of said circuit elements being coupled to an associated set of nodes in said circuit, said circuit elements being capable of carrying a current between a pair of said nodes of said set, said apparatus comprising:

selection means for selecting a circuit element to be simulated;

a first memory coupled with said selection means for storing the characteristics of each of said plurality of circuit elements, said characteristics including the respective one of said set of nodes and a scaling factor associated with each of said pair of nodes; said first memory being responsive to a first signal to identify the characteristics of said selected circuit element;

means to transfer said characteristics from said first memory to a first register for registering said characteristics of said given circuit element;

a second memory for storing the voltage present at each node in said set of nodes, said second memory being responsive to a second signal to identify the voltage present at each node of said selected circuit element;

means to retrieve from said second memory, the nodal voltages of each of said set of nodes registered in said first register, and transfer said nodal voltages to a second register;

a computation unit coupled with said first and second registers, comprising:

comparing means to compare the voltages present at said pair of nodes, so as to determine the direction of current therebetween;

a first subtracting means for determining the voltage difference between said pair of nodes;

a first circuit coupled with said first subtracting means to determine the current flowing between said pair of nodes, said current being a function of a set of variables including said voltage difference and the scaling factors of said current carrying nodes;

a second circuit coupled with said first circuit for ascertaining the change of voltage at each of said current carrying nodes, as a function of said current and said associated scaling factor;

limit value determination means to determine if said change of voltage is greater than a predetermined value, and to generate a limit signal indicating a presence of a voltage change greater than said predetermined value so as to indicate an active circuit element;

a third memory to store said limit; and monitoring means to monitor said limit signal of each of said circuit elements, corresponding to a previous simulation, whereby an analog simulation of a circuit element is diverted if said limit signal indicates an inactive circuit element during said previous simulation.

2. A simulation apparatus as defined in claim 1 wherein said circuit elements are transistors, said set of nodes including an enabling node to control current between said pair of nodes.

3. An analog simulation apparatus as defined in claim 2 wherein said computation unit further comprises identification means coupled to the output of said comparing means for identifying the type of transistor being simulated.

4. A simulation apparatus as defined in claim 2, wherein said computation unit further comprises a third circuit coupled with said identification means to determine the voltage difference between said enabling node and a reference node, defined by one of said current carrying nodes, and the threshold voltage between said enabling node and said reference node.

5. A simulation apparatus as defined in claim 4 wherein said computation unit includes:

a fourth memory for storing values of threshold voltage for a set of transistors, of which said transistor to be simulated is a member.

6. A simulation apparatus as defined in claim 5 wherein said plurality of circuit elements includes field effect transistors, said current carrying nodes being defined by drain and source nodes and said enabling node being defined by a gate node, said voltage between said pair of nodes defining the drain source voltage, said computation unit including:

a second subtracting means to determine the voltage difference between said gate and source nodes and defined as the gate-source voltage, third subtracting means coupled with said second subtracting means and said third memory to determine the voltage difference between said gate source voltage and said threshold voltage, said first circuit including a fifth memory to receive input signals from said first and third subtracting means for identifying values of current stored therein as a variable depending on:
 (i) the voltage difference between said gate-source voltage and said threshold voltage and
 (ii) the drain-source voltage.

7. A simulation apparatus as defined in claim 6 wherein said computation unit includes a first adding means coupled to an output of said fourth memory and said first register to receive respectively in logarithmic form, said current and scaling factor for said drain node, so as to generate the sum of the logarithmic values of said current and said scaling factor and thereby yield the logarithmic value of said voltage change at said drain node;

first exponential generating means to receive said logarithmic value of said drain node voltage change from said first adding means to convert said drain node voltage change to linear form;

a first switching circuit to receive said source node voltage change from said first exponential generating means and input signals from said comparing means and said second register, so as to assign an additive or subtractive sense to said drain node voltage change in accordance with the direction of said current and accordingly determine the adjusted voltage at said drain node;

a second adding means coupled to the output of said fourth memory and said first register to receive respectively in logarithmic form, said current and scaling factor for said source node to generate the sum of the logarithmic values of said current and said scaling factor and thereby yield the logarithmic value of said voltage change at said source node;

a second exponential generating means to receive said logarithmic value of said source node voltage change from said second adding means to convert said source voltage change to linear form; and a second switching circuit to receive said source node voltage change from said second exponential generating means and input signals from said comparing means for assigning an additive or subtractive sense to said source node voltage change depending on the output in accordance with the direction of said current means, and for determining the adjusted voltage at said source node.

* * * * *